United States Patent
Gregory et al.

(10) Patent No.: US 10,825,950 B2
(45) Date of Patent: Nov. 3, 2020

(54) SEMICONDUCTOR SURFACE PASSIVATION

(71) Applicant: Massachusetts Institute of Technology, Cambridge, MA (US)

(72) Inventors: James Gregory, Sudbury, MA (US); Christopher Leitz, Watertown, MA (US); Kevin Ryu, Arlington, MA (US); Donna-Ruth Yost, Acton, MA (US); Vladimir Bolkhovsky, Framingham, MA (US); Renee Lambert, Framingham, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 16/411,419

(22) Filed: May 14, 2019

(65) Prior Publication Data
US 2019/0371855 A1    Dec. 5, 2019

Related U.S. Application Data

(60) Provisional application No. 62/679,449, filed on Jun. 1, 2018.

(51) Int. Cl.
| | |
|---|---|
| *H01L 33/00* | (2010.01) |
| *H01L 27/146* | (2006.01) |
| *H01L 27/148* | (2006.01) |
| *G01T 1/24* | (2006.01) |

(Continued)

(52) U.S. Cl.
CPC ............ *H01L 33/0095* (2013.01); *G01T 1/24* (2013.01); *H01L 21/187* (2013.01); *H01L 21/2007* (2013.01); *H01L 27/14687* (2013.01); *H01L 27/14698* (2013.01); *H01L 27/14831* (2013.01);

(Continued)

(58) Field of Classification Search
CPC .. H01L 21/187; H01L 21/2007; H01L 21/447
See application file for complete search history.

(56) References Cited

U.S. PATENT DOCUMENTS

| | | | |
|---|---|---|---|
| 6,323,109 B1 * | 11/2001 | Okonogi | ............. H01L 21/3226 257/E21.32 |
| 2015/0214047 A1 * | 7/2015 | Hama | ................ H01L 21/0228 438/285 |

(Continued)

OTHER PUBLICATIONS

He et al., Combined Surface Activated Bonding (SAB) Approach for SiO2 Direct Wafer Bonding in Vacuum, 2015, ICEP-IAAC 2015 Proceedings, pp. 65-67 (Year: 2015).*

(Continued)

*Primary Examiner* — Eduardo A Rodela
(74) *Attorney, Agent, or Firm* — Nields, Lemack & Frame, LLC

(57) ABSTRACT

A new process that enables void-free direct-bonded MBE-passivated large-format image sensors is disclosed. This process can be used to produce thin large-area image sensors for UV and soft x-ray imaging. Such devices may be valuable in future astronomy missions or in the radiology field. Importantly, by controlling the hydrogen concentration in the silicon oxide layers of the image sensor and the support wafer, voids in the bonding interface can be significantly reduced or eliminated. This process can be applied to any wafer that includes active circuitry and requires a second wafer, such as a support wafer.

17 Claims, 6 Drawing Sheets

(51) Int. Cl.
H01L 21/20 (2006.01)
H01L 21/18 (2006.01)
(52) U.S. Cl.
CPC ........ *H01L 33/005* (2013.01); *H01L 33/0093* (2020.05)

(56) References Cited

U.S. PATENT DOCUMENTS

2019/0348459 A1* 11/2019 Katkar .................. H01L 24/18
2020/0194474 A1* 6/2020 Meynants ......... H01L 27/14685

OTHER PUBLICATIONS

Howlader et al., Sequential Plasma-Activated Bonding Mechanism of Silicon/Silicon Wafers, Aug. 2010, Journal of Microelectromechanical Systems, vol. 19, No. 4, pp. 840-846 (Year: 2010).*
Burke et al., "Soft-X-Ray CCD Imagers for AXAF", IEEE Transactions on Electron Devices, vol. 44, No. 10, pp. 1633-1642, 1997.
Christiansen et al., "Wafer Direct Bonding: From Advanced Substrate Engineering to Future Applications in Micro/Nanoelectronics", Proceedings of the IEEE, vol. 94, No. 12, pp. 2060-2106, 2006.
Gösele et al., "Semiconductor Wafer Bonding", Annual Review of Materials Science, vol. 28, pp. 215-241, 1998.
Hara, "Diffusion Coefficient of Hydrogen in Silicon at an Intermediate Temperature", Japanese Journal of Applied Physics, vol. 46, No. 3A, pp. 962-964, 2007.
Maszara et al., "Bonding of Silicon Wafers for Silicon-On-Insulator", Journal of Applied Physics, vol. 64, No. 10, pp. 4943-4950, 1988.
Niikzad et al., "Delta-Doped Electron-Multiplied CCD with Absolute Quantum Efficiency over 50% in the Near to Far Ultraviolet Range for Single Photon Counting Applications", Applied Optics, vol. 51, No. 3, pp. 365-369, 2012.
Ryu et al., "Development of CCDs for REXIS on OSIRIS-REx", Proceedings of SPIE, vol. 9144, 2014.
Suntharalingam et al., "Scientific, Back-Illuminated CCD Development for the Transiting Exoplanet Survey Satellite", International Image Sensor Workshop, 2015.
Tonry et al., "Results from the Pan-STARRS Orthogonal Transfer Array (OTA)", Proceedings of SPIE, vol. 7021, 2008.
Warner et al., "Low-Temperature Oxide-Bonded Three-Dimensional Integrated Circuits", IEInternational SOI Conference, pp. 123-125, 2002.
Westhoff et al., "Radiation-Hard, Charge-Coupled Devices for the Extreme Ultraviolet Variability Experiment", Proceedings of SPIE, vol. 6686, 2007.
Westhoff et al., "Low Dark Current, Back-Illuminated Charge Coupled Devices", Proceedings of SPIE, vol. 7249, 2009.

* cited by examiner

SEMICONDUCTOR SURFACE PASSIVATION

This application claims priority to U.S. Provisional Patent Application Ser. No. 62/679,449, filed Jun. 1, 2018, the disclosure of which is incorporated by reference in its entirety.

This invention was made with Government support under Grant Nos. FA8721-05-00002 and FA8702-15-D-0001 awarded by the U.S. Air Force. The Government has certain rights in the invention.

FIELD

This disclosure relates imaging devices, and more particularly to back-illuminated imaging devices.

BACKGROUND

Large-area charge-coupled devices (CCDs) have contributed significantly to visible and x-ray astronomy. CCDs offer excellent photometry and sensitivity owing to their linearity, response uniformity, and single-digit electron read-noise. CCDs will continue to play a critical role in future astronomy missions. Currently, there are several concepts that propose using CCDs for UV and soft x-ray missions.

In order to increase quantum efficiency and fill-factor of the CCDs, they are typically back-illuminated. Prior to the back illumination, the CCDs are usually approximately 725-μm thick (for 200-mm diameter wafers), and the back surface has over 600 μm of field-free region. The field-free region causes the electrons to diffuse in random directions before being collected in the pixel and leads to a degraded point spread function (PSF). To eliminate the field-free region, the silicon must be depleted all the way to the back surface so that the generated electrons are collected with minimal spreading. One way to achieve this is to reduce the thickness of the silicon, removing silicon from the side of the wafer opposite the transfer gates of the CCD. This back surface then is illuminated by the scene of interest. Because the CCD wafer is thinned to a small fraction of its initial thickness, it is usually bonded to a handle wafer (which provides mechanical support) before thinning commences. After the silicon is made thin enough, the back surface must be passivated. The back-passivation layer serves to suppress dark current generated from surface defect states, collect holes generated in the silicon, and ground the back surface. This layer is preferably thin to absorb as few photons as possible. Absorption length is on the order of 10 nm for ultraviolet (UV) and soft x-ray bands and is the shortest for wavelengths around 340 nm. Hence, a shallow backside passivation layer can improve quantum efficiency (QE) for these bands.

Molecular-beam epitaxial (MBE) passivation is an attractive process to passivate the back surface, although many other methods exist. MBE passivation of the back surface has been demonstrated to have excellent UV QE and to be sturdy against radiation damage. The MBE process is unique in that it can dope the silicon at or above the equilibrium solid solubility limit, allowing passivation with only a few nm of thickness of heavily doped film. Additionally, the MBE film can be grown at temperatures compatible with metallized CCD wafers because growth is conducted in ultra-high vacuum (UHV) where the background contamination incorporation is low.

Past processes, however, required temperatures at or above about 300° C. This temperature is problematic for the adhesive bonding processes widely used for back-illumination, due to softening and outgassing of the adhesive. Therefore, direct wafer bonding, whereby wafers are made ultra-flat (usually by deposition and chemical-mechanical planarization of silicon dioxide films) and bonded without adhesive interlayers, is utilized but outgassing of deposited films in the wafers is still problematic. It would be beneficial if there were a novel process to construct a back-illuminated CCD that did not experience outgassing. Further, a back-illuminated CCD produced by this process would be advantageous.

SUMMARY

A new process that enables void-free direct-bonded MBE-passivated large-format image sensors is disclosed. This process can be used to produce thin large-area image sensors, such as CCDs, for UV and soft x-ray imaging. Such devices may be valuable in future astronomy missions or in the radiology field. Importantly, by controlling the hydrogen concentration in the silicon oxide layers of the image sensor and a second wafer, voids in the bonding interface can be significantly reduced or eliminated. This process can be applied to any wafer that includes active circuitry and requires a second wafer, such as a support or handle wafer.

BRIEF DESCRIPTION OF THE DRAWINGS

For a better understanding of the present disclosure, reference is made to the accompanying drawings, which are incorporated herein by reference and in which.

DETAILED DESCRIPTION

FIGS. 1A-1D show a pictorial representation of the manufacturing process used to create a back-illuminated image sensor. While this disclosure describes the process for manufacturing a back-illuminated image sensor, it is understood that the process is suitable for any semiconductor device to which a second wafer is attached. More specifically, the present process is performed at temperatures sufficiently low such that circuitry and metallization layers disposed on the semiconductor wafer can withstand the temperatures without performance degradation. Thus, the present method also applies to any back-illuminated imaging device. For example, this method can also be applied to an active-pixel sensor, photodiode, avalanche photodiode, or other type of imaging device.

Figure 1:
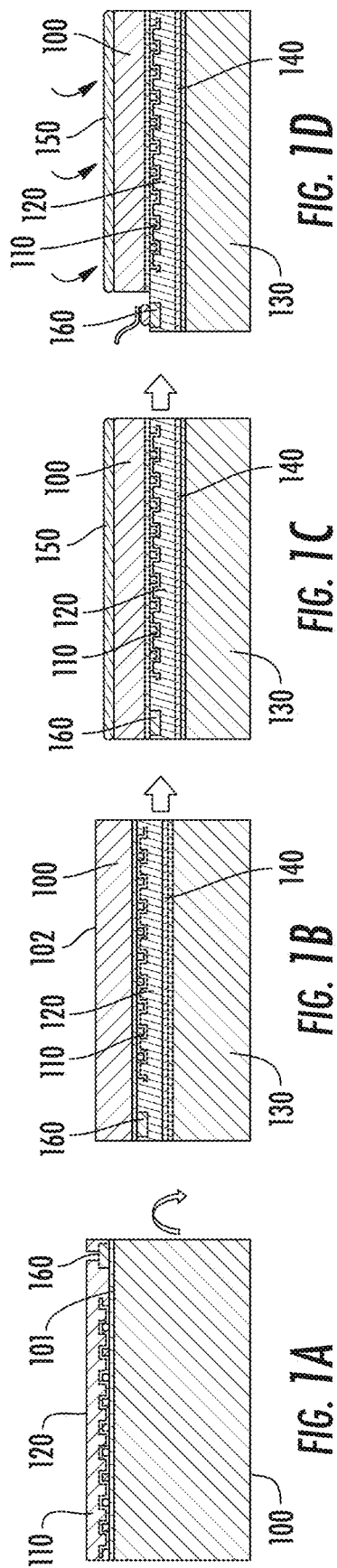
FIGS. 1A-1D show a pictorial representation of the manufacturing process according to one embodiment.

In FIG. 1A, an image sensor 100 is created. This image sensor 100 may be a traditional front-illuminated CCD, which may be manufactured using any traditional process. Alternatively, the image sensor 100 may be an active-pixel sensor, photodiode, avalanche photodiode, or other type of imaging device. The image sensor 100 has circuitry 110, such as poly-silicon gates, disposed on its top surface 101. Additionally, bonding pads 160 are disposed on the top surface 101. The image sensor 100 may be approximately 725 μm thick in certain embodiments, although other thicknesses are also possible. In addition to the circuitry 110, there may be one or more metallization layers on the top surface 101 of the image sensor 100. A first silicon oxide layer 120 is grown, deposited or otherwise provided on top of the circuitry 110.

A support wafer 130, also referred to as a handle or handle wafer, is also provided, as shown in FIG. 1B. A second silicon oxide layer 140 is grown, deposited or otherwise provided on the top surface of the support wafer 130. Both the image sensor 100 and support wafer 130 are planarized to sub-nanometer surface roughness, usually via chemical-mechanical polishing (CMP). The image sensor 100 is then inverted and contacts the support wafer 130, such that the first silicon oxide layer and the second silicon oxide layer are in contact with each other. In the presence of heat, the two silicon oxide layers form covalent bonds therebetween, effectively joining the support wafer 130 to the image sensor 100. This is referred to as direct bonding. As is also shown in FIG. 1B, the image sensor 100 is thinned after the direct bonding by removing material from the back surface 102 of the image sensor 100.

In FIG. 1C, a film 150 is deposited on the back surface 102 of the image sensor 100. This film 150 may be deposited using molecular beam epitaxy (MBE). This film 150 is used to passivate the back surface 102. The film 150 serves to suppress dark current generated from surface defect states, collect holes generated in the silicon, and ground the back surface 102. This film 150 is preferably thin to absorb as few photons as possible. In some embodiments, this film 150 is a silicon layer, doped p-type or n-type, and is preferably doped as highly as possible to suppress dark current effectively.

Lastly, as shown in FIG. 1D, the bonding pads 160, which were disposed on the top surface 101 of the image sensor and were buried by the support wafer 130, are exposed using a lithography and dry etch process. At the completion of these processes, an electronic device, such as a back-illuminated CCD, has been created.

Figure 2:
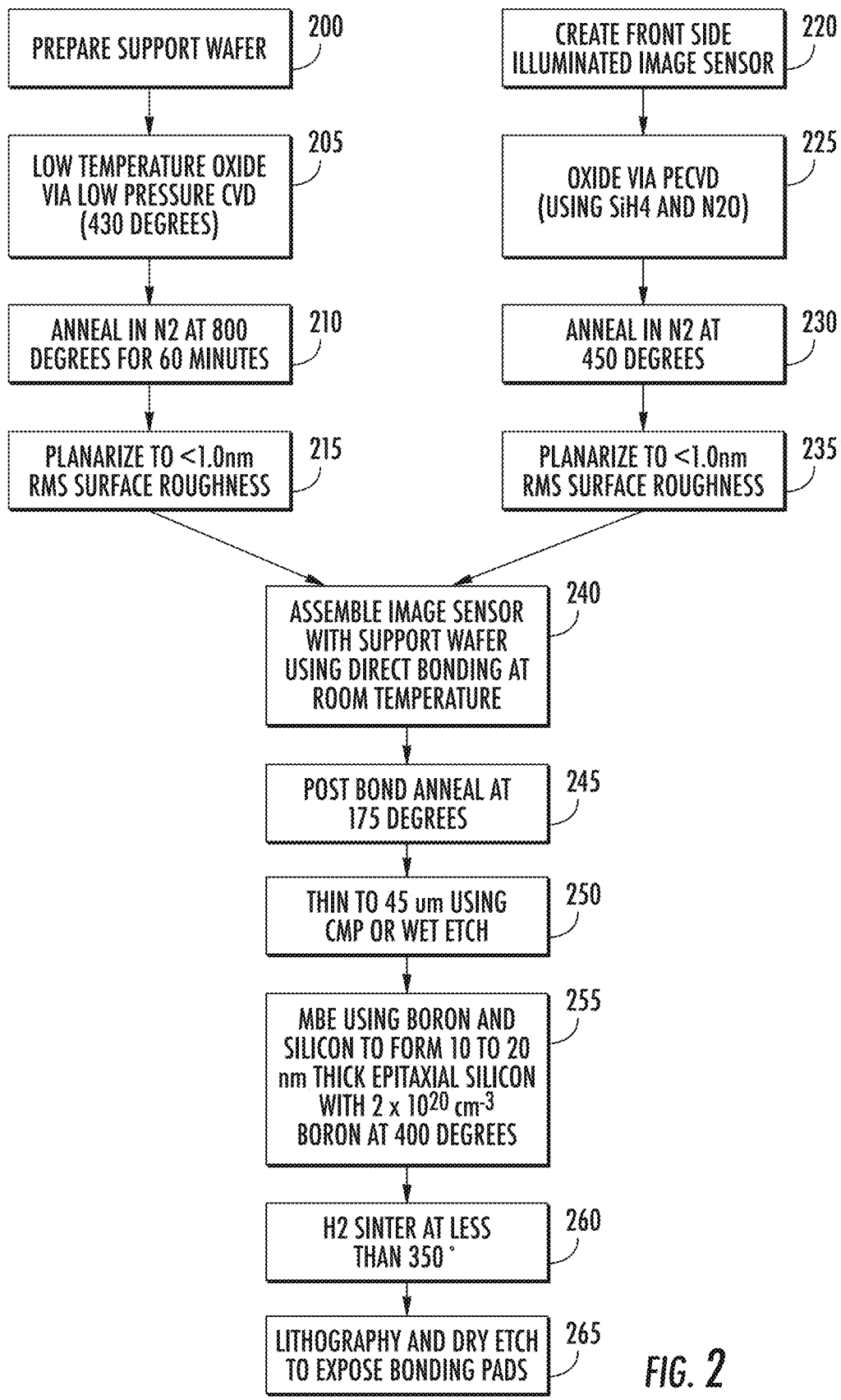
FIG. 2 shows a flowchart showing the sequence of processes performed to create the back-illuminated image sensor.

FIG. 2 shows a detailed flowchart showing the manufacturing process to create an image sensor, such as a back-illuminated CCD.

Processes 200-215 are directed toward the processing of the support wafer 130 prior to its attachment to the image sensor 100. Likewise, processes 220-235 are directed toward the processing of the image sensor 100 prior to its attachment to the support wafer 130. The remaining processes take place after the support wafer 130 and the image sensor 100 have been direct bonded.

First, as shown in Process 200, a support wafer 130 is provided. The support wafer 130 may be a silicon wafer, having the same diameter as the image sensor 100. The thickness of the support wafer 130 is not critical, as this will be the non-illuminated side of the completed image sensor, which may be a back-illuminated CCD.

As shown in Process 205, a second silicon oxide layer 140 is formed on the top surface of the support wafer 130. Since the support wafer 130 has no active devices, it can be exposed to any desired temperature before it is bonded to the image sensor 100. Any suitable process may be used to deposit the second silicon oxide layer 140. The second silicon oxide layer 140 is usually 500-1500 nm thick, sufficiently thick to enable planarization without causing excessive bow of the support wafer 130. The second silicon oxide layer 140 may be deposited using a low-temperature oxide (LTO) deposited via low-pressure chemical vapor deposition (CVD). Alternatively, plasma enhanced CVD (PECVD) may be used to create the second silicon oxide layer 140. In other embodiments, a thermal oxide may be grown using high temperature in an oxygen rich environment. In certain embodiments, LTO may be preferable as it may create the strongest bonds when attached to the image sensor 100. The LTO may be deposited using low pressure CVD at 430° C. Typically, silane ($SiH_4$) and $N_2O$ are used to supply the silicon and oxygen needed for the second silicon oxide layer 140. In one embodiment, a boron doped oxide may be grown on the top surface of the support wafer 130. This may be achieved by adding borane or a similar gas to the CVD process.

Next, as shown in Process 210, an anneal in a nitrogen environment is performed at 800° C. for 60 minutes, although other temperatures and time durations may be used. As noted above, silane is used as the precursor for the silicon in the silicon oxide layer. However, some of the hydrogen in the silane may also be deposited on the support wafer 130. The purpose of the anneal is to remove the hydrogen from the second silicon oxide layer 140.

Finally, as shown in Process 215, the top surface of the support wafer 130 is planarized to less than 1.0 nm RMS surface roughness. This may be achieved using chemical-mechanical polishing (CMP). Prior to bonding, the support wafer 130 may be cleaned in $NH_3$—$H_2O_2$—$H_2O$ solutions. At this point, the support wafer 130 is ready for direct bonding.

As shown in Process 220, an image sensor 100 is created. This image sensor 100 may be a traditional front-illuminated CCD, which may be manufactured using any conventional process, or another type of image sensor. This is a fully functional detector. As such, the image sensor 100 cannot tolerate temperatures above about 500° C. as the metallization layer would degrade. This may be referred to as the critical temperature. Thus, the image sensor 100 cannot be exposed to temperatures above the critical temperature, and more preferably, should be exposed to temperatures no greater than 400-450° C. The size of the image sensor may vary from 30×60 mm to 50×40 mm.

Next, as shown in Process 225, a first silicon oxide layer 120 is formed on the top surface 101 of the image sensor 100, on top of the circuitry 110 and metallization layer. Because the image sensor 100 cannot support process temperatures above approximately 500° C. without degradation (in particular, without an increase in the sheet resistance of metallization layers), low-temperature plasma-enhanced chemical vapor deposition (PECVD) oxides are typically utilized. These films are generally deposited between 150-400° C., at pressures of a few Torr, using $SiH_4$ and $N_2O$ precursor gases. The typical film thickness is 500-3000 nm, which is thick enough to enable chemical-mechanical planarization without causing excessive wafer bow of the image sensor 100. Because the image sensor 100 has topography, while the support wafer 130 does not, generally larger silicon oxide thicknesses are needed for first silicon oxide layer 120 than for second silicon oxide layer 140. In some cases, multiple rounds of silicon oxide deposition and chemical-mechanical planarization may be needed to provide image sensor 100 sufficiently flat on the macro-scale to enable continuous wafer bonding to the support wafer 130 without voids that reflect the pattern on the image sensor 100; such as due to abrupt topographical changes.

As shown in Process 230, the image sensor 100 with the first silicon oxide layer 120 is then annealed in a nitrogen environment at 450° C. for 60 minutes. Of course, other temperatures and durations may be used, as long as the temperature remains less than the critical temperature.

Finally, like the support wafer 130, the image sensor 100 is then planarized to less than 1.0 nm RMS surface roughness, as shown in Process 235. This may be achieved using chemical-mechanical polishing (CMP). Prior to bonding, the image sensor 100 may be cleaned in $NH_3$—$H_2O_2$—$H_2O$ solutions. At this point, the image sensor 100 is ready for direct bonding.

Next, the image sensor 100 is attached to the support wafer 130, as shown in Process 240. The first silicon oxide layer 120 of the image sensor 100 contacts the second silicon oxide layer 140 of the support wafer 130 and bonding is maintained at room temperature through van der Waals forces.

Following this, as shown in Process 245, a post-bond anneal is performed at low temperatures, such as between 175° C. and 250° C. This results in the formation of covalent bonds between the two silicon oxide layers which bond the support wafer 130 and the image sensor 100 together. The resulting bond strength was approximately 1-1.5 $J/m^2$. In some embodiments, plasma treatments may be utilized prior to wafer bonding to enable strong, covalent wafer bonds at lower temperature, as low as room temperature.

By attaching a support wafer 130 to the image sensor 100, the image sensor 100 can be thinned to thicknesses below 10 μm without the challenge of handling such a thin wafer. Such thin devices can lead to better PSF, especially for UV CCDs. This method also provides additional options for thinning the wafer such as mechanical grinding/CMP and chemical thinning. However, the conventional support wafer bonding using adhesives cannot support the temperature required for high-quality single crystal homo-epitaxy of silicon. In other words, a later process, molecular beam epitaxy, requires temperatures of 300° C. or higher. Adhesives outgas at these temperatures and therefore are not suitable for use. Consequently, the present method utilizes direct bonding of the support wafer 130 to the image sensor 100.

As shown in Process 250, the image sensor 100 is then thinned using CMP, grinding, dry etch, or wet etch. The final thickness may be between a few micrometers and hundreds of micrometers. In certain embodiments, the thickness maybe between 45 and 100 μm.

Next, as shown in Process 255, the back surface 102 of the image sensor 100 is subjected to molecular beam epitaxy (MBE) to form an epitaxial silicon layer, having a boron concentration of about $2 \times 10^{20}$ $cm^{-3}$. This process is performed at above 300° C. at low background pressures, usually below $10^{-1o}$ Torr.

At 400° C., which is sufficiently below the critical temperature, a 10 nm-thick film was grown with resistivity of 542 Ohm/sq and excellent sheet resistance uniformity. The activated boron concentration was estimated to be about $2.1 \times 10^{20}$ $cm^{-3}$, close to the boron solubility limit at 1000° C. and unobtainable with other methods such as ion implant and laser annealing (IILA) for furnace annealing.

Figure 3B:
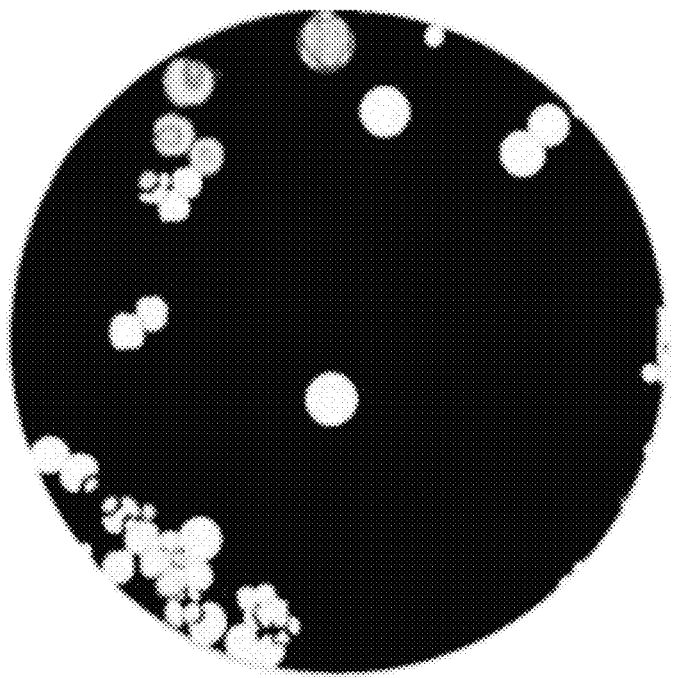
FIGS. 3A-3B show acoustic micrographs of a bonded wafer pair before and after a 10-hr high temperature process.
Figure 3A:
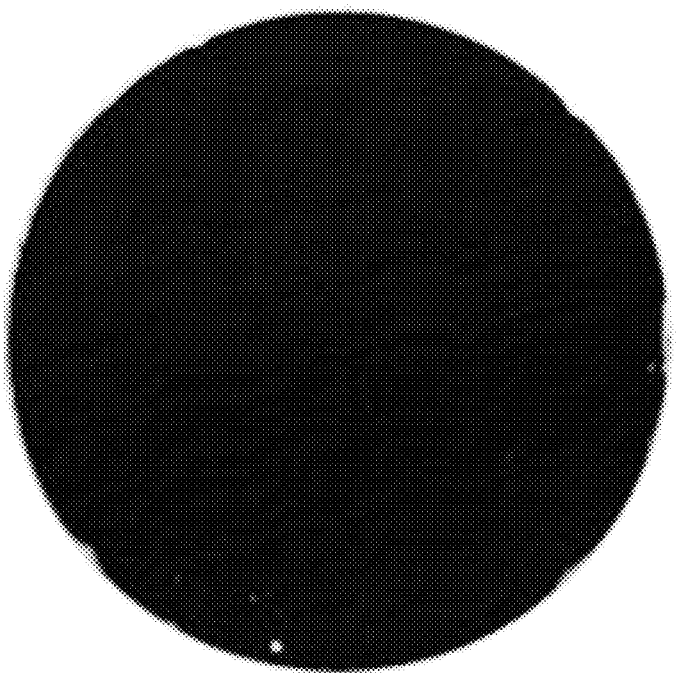

However, unexpectedly, it was found that voids develop at the bond interface during this MBE process, and even for temperatures as low as 250° C. For example, FIGS. 3A-3B show acoustic micrographs of a bonded wafer pair before and after a 10-hr high temperature process, which was meant to simulate an MBE process. Voids at the bond interface appear as white regions while bonded regions are black. While the bonded pair initially exhibited a low density of voids at the bond interface, as shown in FIG. 3A, large number of voids nucleated during the high temperature process, as shown in FIG. 3B. Similar results were seen for shorter times and for a wide variety of oxides on the mating surface of each wafer, including LTO-LTO, PECVD-PECVD, thermal oxide-LTO, and thermal oxide-PECVD. FIGS. 3A-3B also demonstrate that voids can both propagate from existing voids in the as-bonded pair (e.g. around the 9 o'clock position, a small void present after bonding propagates many larger voids after the post-thinning anneal), and by nucleation in regions that are apparently without any nearby voids present in the as-bonded wafer. Therefore, merely forming a wafer pair that is free of voids as-bonded is not sufficient to avoid nucleation of new voids during subsequent high-temperature process steps.

FIG. 3B appears to indicate that voids arise from trapped gas within the bonded wafer stack that migrates to the bond interface. For example, in a few cases, the voids had fractured the thinned silicon, an indication of high pressure inside the void cavity, leading to the gray regions around 2 to 3 o'clock in FIG. 3B. The fracture of overlying silicon films would have an extremely deleterious impact on yield, while even closed voids might open during subsequent process steps or result in large chips during wafer dicing. Thus, this process is not capable of yielding large numbers of science-grade image sensors with MBE back-surface passivation.

The formation of voids due to trapped gases in deposited silicon oxide layers or from byproducts of reactions at the bond interface is a well-known phenomenon. A commonly utilized method to avoid void nucleation is to anneal the silicon oxide layers in dry nitrogen at a higher temperature than those seen in post-bond processing, which presumably results in out-gassing of the silicon oxide layer. Although the silicon oxide layers deposited on the bonded pair in FIGS. 3A-3B had been annealed at elevated temperatures prior to bonding, a large number of voids nucleated at only 250° C. It was also found that annealing the silicon oxide layers at 500° C. (the critical temperature) prior to bonding did not alter this behavior, even with the additional precaution of cooling down to below 100° C. in dry nitrogen.

Figure 4:
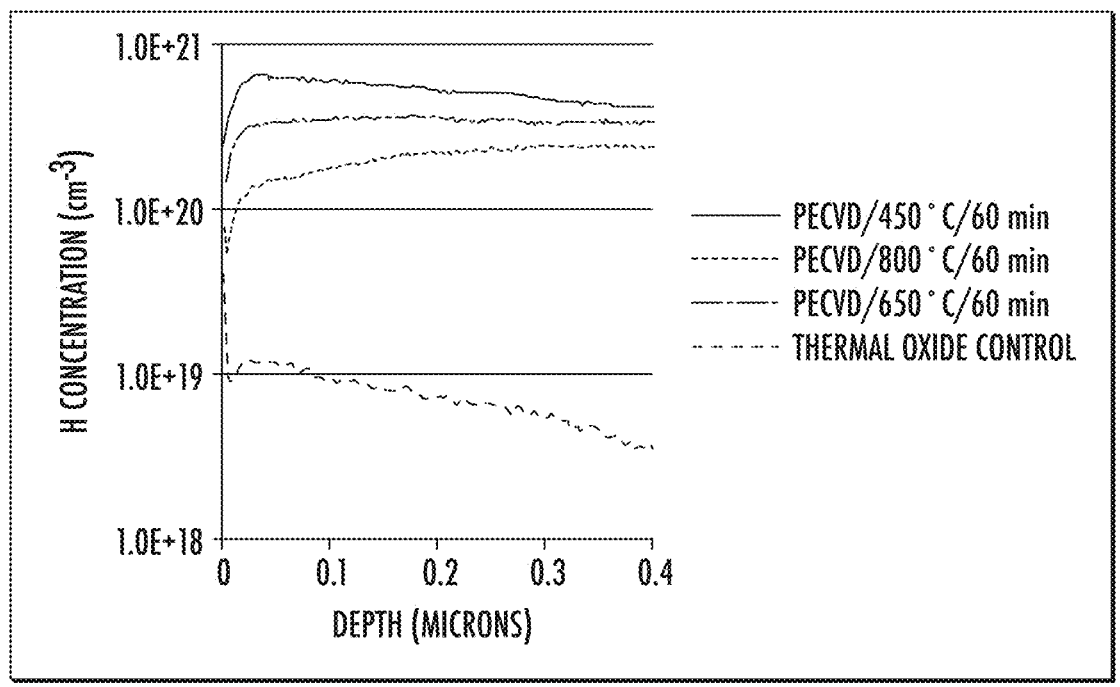
FIG. 4 is a graph comparing hydrogen depth profiles for PECVD-deposited films annealed in nitrogen at the different temperatures to the concentration of hydrogen in thermal oxide.

It was next investigated whether anneals in dry nitrogen could reduce the hydrogen content in PECVD-deposited silicon oxide layers to the levels seen in thermal $SiO_2$, using secondary ion mass spectrometry (SIMS) to measure a depth profile of hydrogen concentration in the film. These results are shown in FIG. 4, which compare depth profiles for PECVD-deposited films annealed in nitrogen at the different temperatures to the concentration of hydrogen in thermal oxide. All anneals in this test were performed for 60 minutes. FIG. 4 indicates that the hydrogen concentration in PECVD-deposited oxides is significantly higher than thermal oxide, even for an 800° C. anneal. Note that this is an unrealistic post-deposition anneal temperature for an image sensor as it is above the critical temperature. The same analysis was performed on LTO-deposited films and similar results were obtained. Finally, 60 min and 600 min anneals at 500° C. were compared. No significant reduction in hydrogen concentration was detected with the longer anneal time. It was concluded that trapped hydrogen could not be removed effectively via post-deposition anneals within the thermal-budget limitations of the image sensor 100.

Figure 5:
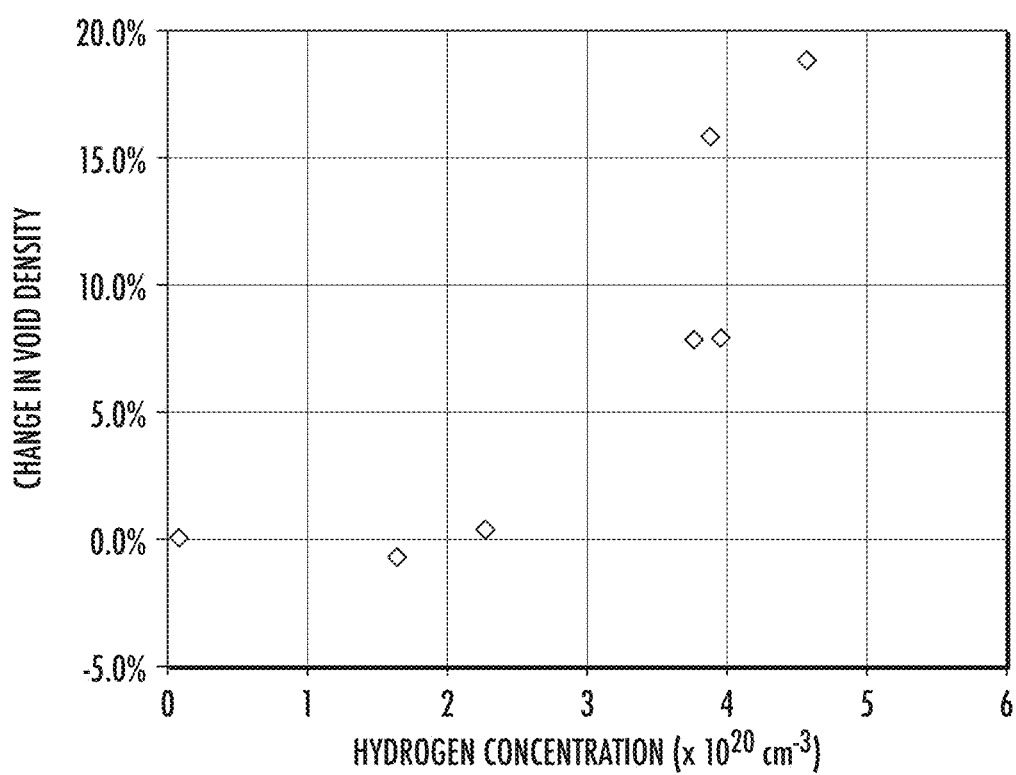
FIG. 5 is a graph showing the relationship between hydrogen concentration and increase in void formation.

A subsequent test was performed to determine the relationship between hydrogen concentration and increase in void formation. The results of this test are shown in FIG. 5. In this plot, the hydrogen concentration shown is an average through a 500-nm thick film and is given as the maximum of either the LTO or PECVD-deposited oxide concentration. The change in void density of wafer pairs bonded with LTO on one wafer and PECVD-deposited oxide on the other wafer was measured by comparing the total area of voids in acoustic microscope images before and after a 250° C. 600 min anneal. FIG. 5 reveals an extremely sharp dependence of void density on hydrogen content. In other words, up to about a hydrogen concentration of $3\times10^{20}$ cm$^{-3}$, there is no increase in the average void density after the 250° C. 600 min anneal. However, at a hydrogen concentration of about $4\times10^{20}$ cm$^{-3}$, the density of voids increases by about 10%. The increase is even greater at a hydrogen concentration of $4.5\times10^{20}$ cm$^{-3}$.

Looking at FIG. 4, the hydrogen concentration for a silicon oxide layer created using a traditional PECVD at 450° C. is about $6\times10^{20}$ cm$^{-3}$. Thus, reducing hydrogen concentration by a factor of 2 or 3 is sufficient to prevent new voids during a 250° C. post-thinning anneal. In other words, if the hydrogen concentration in the bonding interface is maintained at less than $3\times10^{20}$ cm$^{-3}$, voids are not formed.

Since it was determined that even a modest 2-3× reduction in hydrogen concentration in these deposited silicon oxide layers could not be achieved with anneals compatible with image sensor thermal budget limitations, the influence of deposition conditions during PECVD (Process 225) was investigated. Parameters such as deposition temperature, gas flow rates, and RF power can be adjusted.

Surprisingly, it was determined that modifications to the PECVD process were very effective in reducing the hydrogen concentration of the first silicon oxide layer 120.

Specifically, silane and N$_2$O are used in the PECVD process. The silane flows into the chamber at a rate of 300 standard cubic centimeters per minute (sccm). Typically, the N$_2$O flows at a rate of 9500 sccm and pure nitrogen flows at a rate of 1500 sccm. The pressure within the chamber is typically maintained at 2.4 Torr and the power is 1100 W.

An experiment was performed which independently varied the flow of N$_2$O, the power used in the chamber and the pressure within the chamber. The values used are shown in Table 1.

TABLE 1

| N$_2$O flow rate | Power | Pressure |
|---|---|---|
| 9500 sccm | 600 W | 2.4 Torr |
| 11000 sccm | 850 W | 2.9 Torr |
| 13000 sccm | 1100 W | 3.3 Torr |

Unexpectedly, it was found that an increase in pressure resulted in lower hydrogen concentrations. In other words, increasing the pressure to 3.3 Torr reduced the hydrogen concentration.

Figure 6:
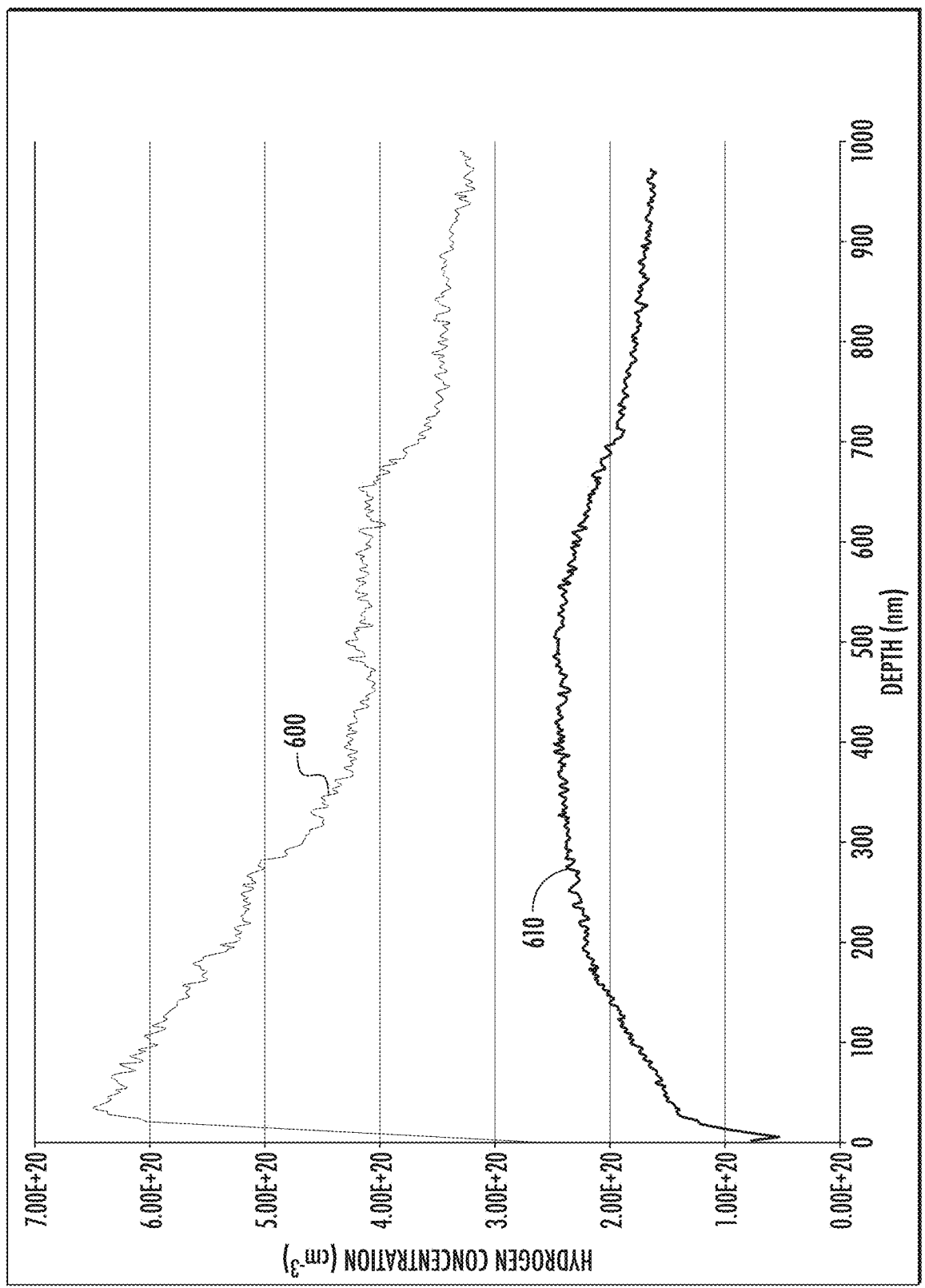
FIG. 6 shows the difference in hydrogen concentration between a silicon oxide layer created using a standard PECVD process and one created using the modified process described herein.

FIG. 6 shows the hydrogen concentration of the first silicon oxide layer 120. The standard recipe 600 results in hydrogen concentrations well above $4\times10^{20}$ cm$^{-3}$. In contrast, the new recipe 610 results in a hydrogen concentration that never exceeds $3\times10^{20}$ cm$^{-3}$. In accordance with FIG. 5, this silicon oxide layer should produce no voids.

Based on these results, Process 225 was performed using the increased pressure of 3.3 Torr. Process 230-255 were then performed as described above. Indeed, as expected, the hydrogen concentration at the bond interface was indeed less than $3\times10^{20}$ cm$^{-3}$, and the finished image sensor displayed no voids.

While the above disclosure describes a modification to the pressure of the typical PECVD process as a mechanism to reduce the hydrogen concentration at the bonding interface, the disclosure is not limited to this embodiment. Any modification to the PECVD process that results in a hydrogen concentration of less than $3\times10^{20}$ cm$^{-3}$ at the bonding interface may be employed.

Returning to FIG. 2, after the MBE process (Process 255) is completed, subsequent processes are performed. During MBE, the interface states at the silicon/oxide interface of the image sensor depassivates due to either elevated temperature or high X-ray dose during e-beam silicon evaporation, leading to elevated dark current. An H$_2$ sinter, shown in Process 260, can passivate these interface states, leading to lower dark current. The standard H$_2$ sinter condition is done in 100% hydrogen at 400° C. for 1 hr. However, this hydrogen sinter also led to appearance of small silicon fracture defects across the wafer. The number of defects is quite significant for yielding large-format image sensors. Upon inspection, these voids appeared to originate within the interlayer dielectric (ILD) films, rather than at the bond interface.

To prevent these defects from forming, a lower-temperature, longer-time hydrogen sinter was developed. Based on extrapolations from hydrogen diffusion coefficients measured at higher temperatures, a sinter at 300° C. for 6 hours provides similar hydrogen diffusion length through silicon as 400° C. for 1 hr. Alternatively, the sinter can be performed at 250° C. for 8 hours. In another embodiment, the sinter may be performed at 350° C. In all these embodiments, the sinter is performed at a temperature that is no greater than 350° C. When this low-temperature sinter process was performed on an oxide-bonded monitor wafer, no additional defects were found. Subsequently the lower hydrogen process was done on an oxide-bonded device wafer and found that this anneal indeed lowered the dark current to expected levels.

Finally, as shown in Process 265, lithography and dry etch processes are used to expose the bonding pads 160. This process results in an image sensor that has been bonded to a second wafer, which is a support wafer, thinned and subjected to a MBE process.

Figure 7:
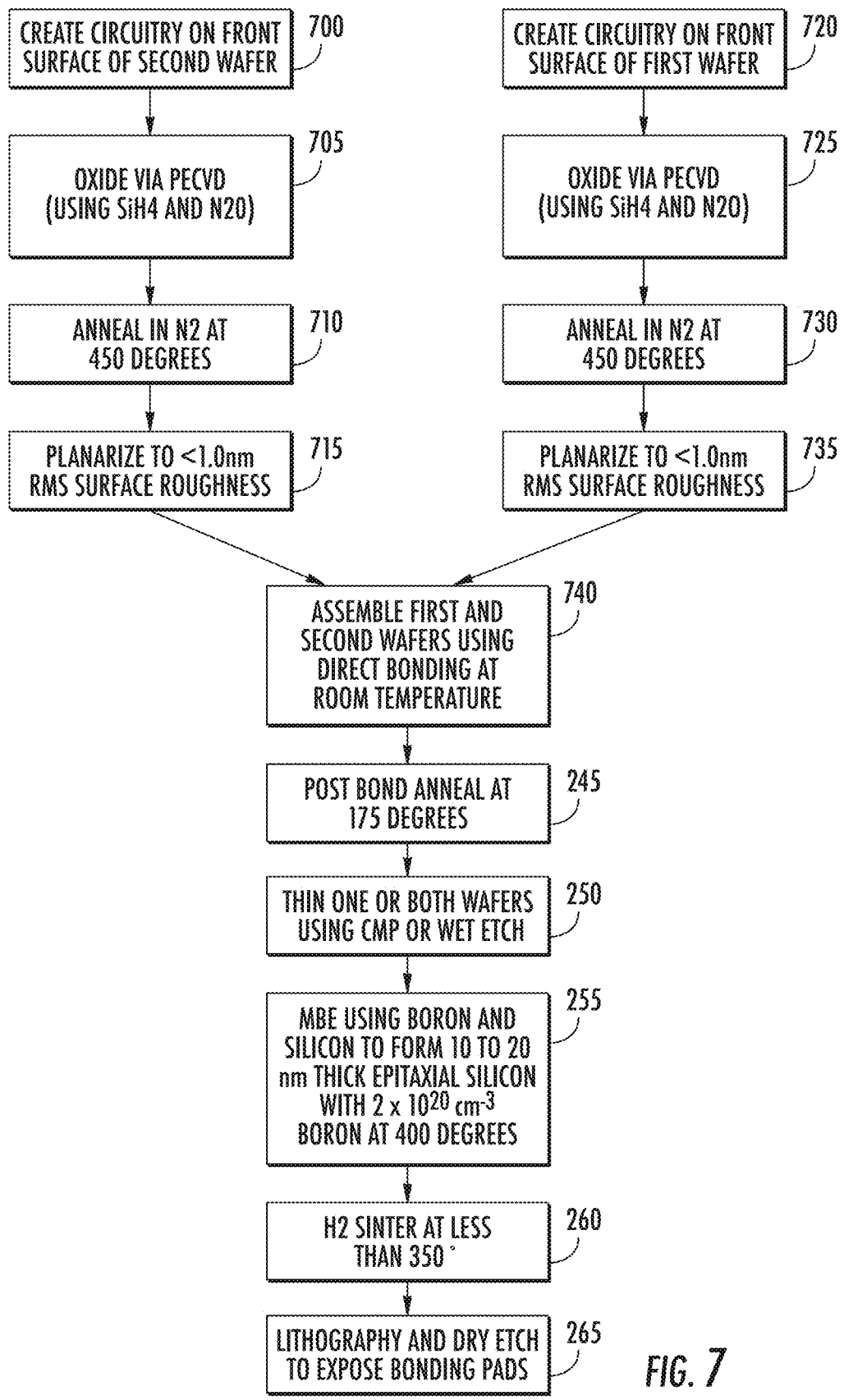
FIG. 7 shows a flowchart showing the sequence of processes performed to bond two wafers with circuitry together.

FIG. 7 shows another embodiment. In this embodiment, the support wafer is not used; rather a wafer having circuitry disposed on at least one surface is employed. In this embodiment, the second wafer (which, in FIG. 2, was the support wafer) is processed so as to have circuitry on the front surface, as shown in Process 700. Because the second wafer now has circuitry, it must be processed in the same manner as the image sensor 100 of FIG. 2. In other words, as shown in Process 705, the oxide layer is deposited using PECVD, as was previously described with respect to Process 225 on FIG. 2. As shown in Process 710, the second wafer is then annealed in nitrogen at 450° C. Finally, the second wafer is planarized to less than 1.0 nm RMS, as shown in Process 715. In other words, because the second wafer now has active circuitry, it is processed in the same manner as the image sensor as shown in Process 225-235 in FIG. 2.

The first wafer is also processed in the same manner as the image sensor 100. Thus, Processes 725-735 are identical to Processes 225-235 of FIG. 2. The first wafer and second wafer are then bonded together using direct bonding at room temperature, as shown in Process 740. In certain embodiments, the front surface of the first wafer is bonded to the front surface of the second wafer. In other embodiments, the front surface of the first wafer may be bonded to the back surface of the second wafer. In yet another embodiment, the front surface of the second wafer may be bonded to the back surface of the first wafer.

The remaining steps (Processes 245-265) are identical to those described in FIG. 2, and are not described again.

It is noted that in yet another embodiment, more than two wafers may be bonded together. For example, a stack may be created by bonding three or more wafers together.

In this embodiment, the first two wafers may each be prepared as shown in Processes 700-715 or as shown in Processes 200-215, for a support wafer. The bonding process is then performed. In other words, the first two wafers are bonded together, as shown in Process 740 to create a combined wafer. In some embodiments, the remaining processes, Processes 245-265 are then performed. In another embodiment, only some of Processes 245-265 are performed at this time. For example, the combined wafer may be thinned, as shown in Process 250.

Once these two wafers are bonded, they form a combined wafer. A third wafer may then be bonded to this combined wafer. To do this, the combined wafer is now treated as the first wafer as shown in FIG. 7. In other words, the combined wafer is subjected to Processes 725-735 to grown a silicon oxide layer and prepare it for bonding to the third wafer. This third wafer may be a support wafer, which is processed as shown in Processes 200-215 of FIG. 2. In another embodiment, the third wafer may also have circuitry and is processed as shown in Processes 700-715 of FIG. 7. This third wafer may then be bonded to the combined wafer, as shown in Process 740. As described above, in each embodiment, the hydrogen concentration in the silicon oxide layer is less than $3\times10^{20}$ cm$^{-3}$.

Again, the newly formed stack may be subjected to some or all of Process 245-265 after bonding. This sequence can be repeated for an arbitrary number of wafers, thus resulting in a stack of three of more discrete wafers that are directly bonded together. As noted above, the MBE process (Process 255) may be performed after the entire stack is assembled, or may be performed after the first two wafers have been bonded together.

For example, this process may be used to form a 3-layer stack with digital circuits on the bottom, analog on the middle, and imagers on the top. The bottom two layers may be connected with the front surfaces of each in contact, then the wafer in the middle layer would be thinned to reveal through-silicon vias, which are already present. The top layer, or the imager wafer would be bonded to the middle tier with its front surface in contact with a back surface of the middle layer with through-silicon vias connected to the imager periphery.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of direct bonding a wafer having circuitry disposed thereon to a second wafer, comprising:
   growing a first silicon oxide layer on top of the circuitry;
   growing a second silicon oxide layer on the second wafer;
   contacting the first silicon oxide layer and the second silicon oxide layer to form an electronic device; and
   annealing the electronic device at a temperature less than 500° C.,
   wherein the first silicon oxide layer and the second silicon oxide layer each have an average hydrogen concentration of less than $3\times10^{20}$ cm$^{-3}$.

2. The method of claim 1, wherein the first silicon oxide layer is grown using PECVD.

3. The method of claim 1, wherein the second wafer comprises a support wafer and the second silicon oxide layer is grown using a low-temperature oxide (LTO) deposited via low-pressure chemical vapor deposition.

4. The method of claim 1, further comprising creating circuitry on one surface of the second wafer.

5. The method of claim 4, where the second silicon layer is grown on top of the circuitry.

6. The method of claim 4, where the second silicon layer is grown on a surface of the second wafer opposite the circuitry.

7. The method of claim 1, further comprising:
   forming a third silicon oxide layer on the electronic device;
   growing a fourth silicon oxide layer on a third wafer;
   contacting the third silicon oxide layer and the fourth silicon oxide layer to form a stack.

8. A device, comprising:
   a silicon wafer having circuitry on one surface and a first silicon oxide layer disposed on top of the circuitry; and
   a second wafer having a second silicon oxide layer on one surface;
   wherein the second wafer is directly bonded to the silicon wafer using the method of claim 1 such that the first silicon oxide layer is in contact with the second silicon oxide layer, and wherein a concentration of hydrogen in a bonding interface of the first and second silicon oxide layers is less than $3\times10^{20}$ cm$^{-3}$.

9. The device of claim 8, wherein the silicon wafer comprises an imaging device.

10. The device of claim 9, wherein the imaging device comprises a charge-coupled device.

11. The device of claim 9, wherein the imaging device comprises an active-pixel sensor.

12. The device of claim 8, wherein the second wafer comprises a support wafer.

13. The device of claim 8, wherein the second wafer comprises circuitry on one surface.

14. The device of claim 13, wherein the second silicon oxide layer is disposed on top of the circuitry.

15. The device of claim 13, wherein the second silicon oxide layer is disposed on a surface opposite the circuitry.

16. The device of claim 8, further comprising a third wafer having a silicon oxide layer on one surface, wherein the third wafer is directly bonded to a silicon oxide layer on the silicon wafer or the second wafer.

17. A method of fabricating a back-illuminated imaging device, comprising:
   creating a front-illuminated imaging device, having front surface with circuitry and a metallization layer thereon;

growing a first silicon oxide layer on top of the circuitry and the metallization layer, wherein the first silicon oxide layer has an average hydrogen concentration of less than $3 \times 10^{20}$ cm$^{-3}$;

contacting the first silicon oxide layer to a second silicon oxide layer, the second silicon oxide layer disposed on a top surface of a second wafer, to form the back-illuminated imaging device;

annealing the back-illuminated imaging device at a temperature below 250° C.;

performing molecular beam epitaxy to a back surface of the front-illuminated imaging device; and performing a hydrogen sinter at a temperature of 350° C. or less.

* * * * *